United States Patent
Shimizume et al.

(10) Patent No.: US 7,626,411 B2
(45) Date of Patent: Dec. 1, 2009

(54) SEMICONDUCTOR DEVICE, SEMICONDUCTOR INTEGRATED CIRCUIT AND BUMP RESISTANCE MEASUREMENT METHOD

(75) Inventors: Kazutoshi Shimizume, Kanagawa (JP); Takaaki Yamada, Kanagawa (JP)

(73) Assignee: Sony Corporation, Tokyo (JP)

( * ) Notice: Subject to any disclaimer, the term of this patent is extended or adjusted under 35 U.S.C. 154(b) by 211 days.

(21) Appl. No.: 11/893,573

(22) Filed: Aug. 16, 2007

(65) Prior Publication Data

US 2008/0048706 A1  Feb. 28, 2008

(30) Foreign Application Priority Data

Aug. 23, 2006  (JP)  ............................ P2006-226598

(51) Int. Cl.
  *G01R 31/26* (2006.01)
  *H01L 29/40* (2006.01)
(52) U.S. Cl. .................... 324/765; 324/754; 324/158.1; 257/777
(58) Field of Classification Search ......... 324/754–765; 257/777
  See application file for complete search history.

(56) References Cited

U.S. PATENT DOCUMENTS 6,833,626 B2 * 12/2004 Kajiwara et al. ............ 257/777
2006/0232292 A1 * 10/2006 Shimizume et al. ......... 324/765
2009/0058435 A1 *  3/2009 Nakamura ................... 324/719

FOREIGN PATENT DOCUMENTS

JP  2003-185710  7/2003

* cited by examiner

Primary Examiner—Ha Tran Nguyen
Assistant Examiner—Emily Y Chan
(74) Attorney, Agent, or Firm—Robert J. Depke; Rockey, Depke & Lyons, LLC

(57) ABSTRACT

The present invention provides a semiconductor device, including: a first semiconductor chip, and a second semiconductor chip connected to the first semiconductor chip through a plurality of bumps having not only a number of main bumps necessary for operation between the chips but also a predetermined number of measurement and control input bumps. Each of the first and second chips includes a plurality of measurement path switches individually connected to the main bumps, a plurality of current path switches connected to connecting points between the main bumps and the measurement path switches, and a control circuit for the measurement path switches, the first semiconductor chip further including a plurality of measurement and control terminals for inputting a control signal of the control circuit and supplying fixed current to be supplied to the current path switches and then measuring the voltage at the connecting points.

10 Claims, 4 Drawing Sheets

SEMICONDUCTOR DEVICE, SEMICONDUCTOR INTEGRATED CIRCUIT AND BUMP RESISTANCE MEASUREMENT METHOD

CROSS REFERENCES TO RELATED APPLICATIONS

The present invention contains subject matter related to Japanese Patent Application JP 2006-226598 filed in the Japan Patent Office on Aug. 23, 2006, the entire contents of which being incorporated herein by reference.

BACKGROUND OF THE INVENTION

1. Field of the Invention

This invention relates to a semiconductor device, a semiconductor integrated circuit and a bump resistance measurement method wherein the connection resistance of an internal bump or main bump for connecting two semiconductor chips can be measured for each bump.

2. Description of the Related Art

In recent years, introduction of a system (SiP: System in Package) single-packaged or a system modularized using a semiconductor technique has been and is proceeding rapidly together with downsizing of an electronic apparatus. A plurality of semiconductor chips are mounted on a mounting substrate of the package.

On the other hand, the system includes a plurality of circuit blocks which handle different signals from each other such as an analog circuit section and a digital circuit section. Further, different performances such as a high speed or a low speed and a high frequency or a low frequency are required for the different circuit blocks. Therefore, it is generally difficult to use a common process to fabricate, at a low cost, a system which satisfies all of the required performances at a high level. However, if packaging is merely performed for each circuit block, then downsizing of an electronic apparatus cannot be achieved. Therefore, it is necessary to incorporate a plurality of chips in one package or one module and interconnect the chips directly.

However, the number of connections between chips is increasing from a reason of multi-functionalization of electronic apparatus and so forth, and downsizing of a connecting portion is required essentially. Therefore, it has been begun to really utilize bumps in place of wire bonds.

Upon bump connection, wiring lines are sometimes wired only between chips without extending to the outside of the SiP. Or, bump connection may assume a CoC (Chip on Chip) connection scheme wherein a plurality of chips are layered in order to implement downsizing of the outer profile of the package. A bump for such connection between chips is generally called "internal bump" in order to distinguish the same from a bump for external connection of the package.

Normally, a small chip or second chip having a high performance is placed on and bump-connected to a large chip or first chip.

For example, a main signal processing LSI is a single chip on which a logic circuit and a DRAM (Dynamic Random Access Memory) are mounted together. While the logic circuit has a high processing speed and requires use of an advanced process, the DRAM does not require a very high processing speed and it does not make a problem even if an expensive advanced process is not used for the DRAM. In other words, where a DRAM and a logic circuit are individually mounted on chips separate from each other and fabricated by different production processes, a system can be produced at a cost lower than that required where a system is produced using a chip on which a DRAM and a logic circuit are mounted together.

In particular, the DRAM is produced using an old low-cost process while the logic circuit is produced using a head process. If a DRAM chip as a second chip is placed on and connected to a completed logic chip as a first chip through a bump to implement a CoC structure, then the cost can be reduced totally.

Conversely, the second chip to be mounted on the first chip may be fabricated using a special process of a high-performance and hence at an increased cost. In this instance, the degree of integration of the second chip is raised as high as possible to achieve downsizing.

Therefore, the CoC structure includes a great number of internal bump connections whose diameter is approximately several tens μm.

Several hundreds to several thousands bump arrays are formed in advance on the first chip to be used as a base, and the second chip is placed on the first chip with a connecting face thereof positioned with respect to first chip. In this state, the first and second chips are heated so as to be contact bonded to each other. However, at this time, a bump may possibly be connected in a displaced relationship to the second chip or a cavity may be produced within a bump because of deviation of a condition or the like. Therefore, while a great number of products are fabricated using the same fabrication apparatus, a package may be produced in a state wherein such a bump connection portion whose reliability is low as just described is mixed in several hundreds to several thousands bumps per one package.

In order to prevent failure of bump connection, it is significant to achieve both of stabilization of fabrication and development of a screening method.

Even if connection of an internal bump in the CoC structure is established but incompletely, if the connection is somewhat sufficient, normal function and operation are allowed. However, there is the possibility that, when a product having such poor connection is placed actually in the market and is acted upon by a mechanical stress or the like, the connection may be cancelled completely thereby disabling the product. Therefore, in order to perform the screening for such products, it is necessary to diagnose the degree of completeness of connections. To this end, it is necessary to measure the connection resistance of the bumps and screen those products whose connection resistance has a certain value or more.

As a method for detecting connection failure of internal bumps, a method has been proposed and is disclosed in Japanese Patent Laid-Open No. 2003-185710 (hereinafter referred to as Patent Document 1). In the method, a switch capable of connecting bumps to each other along a single resistance measurement path is provided on both of a semiconductor chip on the base side and another semiconductor chip to be mounted on the base side semiconductor chip. Further, the resistance value of the bump connection path is measured to detect whether or not a failed connection portion exists.

SUMMARY OF THE INVENTION

However, with the method of Patent Document 1, although it is possible to detect a high degree of failure such as full disconnection failure at a bump or almost failure in connection, a lower degree of failure cannot be detected. This is because, when a voltage is applied across a bump connection path to detect the resistance value of the bump connection path, dispersion of the connection resistance of a bump or dispersion of the wiring line resistance of the path appears as a measurement error.

However, if small connection failure cannot be screened as described above, the possibility of failure after the product is placed on the market cannot be eliminated. Further, in the method of Patent Document 1, even if connection failure can be detected, a bump at a failed place cannot be specified. If bump failure places have a distribution, then the cause of the failure may possibly be found by an analysis of the distribution and a countermeasure may be taken readily. However, with the method of Patent Document 1 described above, it is impossible to specify such a failed place as described above.

On the other hand, although Patent Document 1 does not clearly indicate, if this method is adopted, then it is necessary to electrically disconnect an internal circuit of a chip and a bump upon measurement and then re-connect the internal circuit and the bump after completion of the measurement.

Therefore, it is estimated that it cannot be avoided to take, for example, such a method as described below with reference to FIG. 1.

FIG. 1 representatively shows a single bump Bx used to interconnect two chips and schematically shows control switches and internal circuits connected to the bump Bx.

Referring to FIG. 1, a system (SiP, hereinafter referred to merely as semiconductor device) 100 in the form of a single package includes two semiconductor chips, that is, a chip A (101) and another chip B (102) which are connected to each other through the bump Bx. Each of the chip A (101) and the chip B (102) includes an internal circuit, that is, a circuit 101A or another circuit 102A, and three switches Sa, Sb and Sc for interruption control.

If it is assumed that, upon normal operation, a signal is sent from the chip B (102) to the chip A (101), then a switch Sb is connected between the input of the circuit 101A and the bump Bx while another switch Sc is connected between the output of the circuit 101A and the output terminal 103 of the semiconductor device 100. Further, a switch Sa is provided for connecting the output terminal 103 to the bump Bx bypassing the circuit 101A.

The components mentioned are provided similarly also in the chip B (102) although the input and output relationship is reverse to that described above. In particular, the switch Sb is connected between the output of the circuit 101B and the bump Bx, and the switch Sc is connected between the input of the circuit 101B and the input terminal 104 of the semiconductor device 100. Further, the switch Sa is provided such that it connects the input terminal 104 to the bump Bx bypassing the circuit 101B.

The switch Sa is controlled by a test signal TS, and the switches Sb and Sc are controlled by an inverted test signal TS_ which is an inverted signal of the test signal TS. If it is assumed that the switches Sa, Sb and Sc are switched by "1", then in a normal operation mode, the inverted test signal TS_ is activated into an on state by "1". Consequently, the input terminal 104, circuit 102A, bump Bx, circuit 101A and output terminal 103 are connected in series. At this time, since the test signal TS is "0", the switches Sa are in an off state.

On the other hand, in a test mode, the test signal TS is activated by "1", and consequently, the bump Bx is connected directly between the input terminal 104 and the output terminal 103 through the two switches Sa. At this time, since the inverted test signal TS_ is "0", all of the switches Sb and Sc are in an off state.

Upon testing, an external LSI tester 105 is connected between the output terminal 103 and the input terminal 104, and a fixed voltage is applied across the bump Bx by a fixed voltage circuit 107 provided in the LSI tester 105. At this time, the current value is measured by an ammeter 106 provided in the LSI tester 105, and the connection resistance Rx of the bump Bx is measured based on the current value.

However, according to the configuration described above, the two switches Sa in an on state are inserted in series in the measurement path in the test mode. While the on-resistance of a transistor normally ranges from several Ω to several tens Ω, the connection resistance Rx of the bump Bx of the measurement object is on the order of mΩ and immeasurably low. Besides, in the method of Patent Document 1, such a large number of other bumps as several thousands each providing connection resistance are connected in series to the measurement circuit. Therefore, even where the connection resistance at one of the bumps indicates an abnormal value, there is the possibility that the result of the measurement may fall within a range of an acceptable product. Thus, it is difficult to measure the bump connection resistance with a high degree of accuracy.

In order to measure the bump connection resistance with a high degree of accuracy, the following method may possibly be adopted. In particular, along an assembly line for products of semiconductor devices, a test device for measurement only, that is, a dummy product, to which pads for measuring the bump connection resistance are allocated, is fed periodically so that measurement of the test device is performed.

Although this indirect measurement method can contribute to stabilization of the fabrication line, since actual products are not tested directly, failure on the ppm order cannot be screened. Also it is a possible idea to perform a temperature cycle test wherein a product is placed into a high temperature state and a low temperature state alternately to apply stress to the product and fully break down a bump which exhibits incomplete connection and then establish a state which allows screening in a later function test to perform a test for the product. However, in any case, the cost required for the test is high and the accuracy in screening is low.

Further, in the case of an internal bump which is used only for connection between chips as in the CoC structure, the bump connection resistance cannot be measured if a special test circuit free from such drawbacks as described above is not incorporated.

However, also where a test circuit is formed between an LSI tester and a bump so that contact resistance can be measured, the resistance measurement accuracy is deteriorated significantly by the on-resistance of transistors used as such switches and so forth as shown in FIG. 1. Besides, different from FIG. 1, where three chips are layered, the intermediate chip do not sometimes have a connection terminal to the outside, and in this instance, even the method described hereinabove with reference to FIG. 1 cannot be applied.

Therefore, it is demanded to provide a semiconductor device, a semiconductor integrated circuit and a bump resistance measurement method wherein the connection resistance of interconnection bumps or internal bumps of a plurality of chips formed in the semiconductor device can be measured readily with a high degree of accuracy and at a low cost.

According to an embodiment of the present invention, there is provided a semiconductor device including a first semiconductor chip, and a second semiconductor chip connected to the first semiconductor chip through a plurality of bumps including not only a number of main bumps necessary for operation between the chips but also a predetermined number of measurement and control input bumps, each of the first and second chips including a plurality of measurement path switches individually connected to the main bumps, a plurality of current path switches connected to connecting points between the main bumps and the measurement path switches, and a control circuit for the measurement path switches, the first semiconductor chip further including a plurality of measurement and control terminals for inputting a control signal of the control circuit and supplying fixed current to be supplied to the current path switches and then measuring the voltage at the connecting points.

Preferably, the semiconductor device is configured such that the measurement and control input bumps include a current path bump, a measurement path bump, and a plurality of control input bumps, the measurement and control terminals including a test signal input terminal configured to input a test signal for switching on the current path switches, two current supplying terminals configured to supply fixed current to the current path switches which are in an on state through the current path bump on each of the first and second semiconductor chips, an input terminal for the control signal for operating the two control circuits provided individually on the first and second semiconductor chips, and two voltage measurement terminals used for measurement of a voltage between the opposite ends of the main bump, to which the fixed current is supplied, through the measurement path bump.

More preferably, the semiconductor device is configured such that, on each of the first and second semiconductor chips, a current path switch is provided at each connecting point between the main bumps and the measurement path switches and the connecting point of each measurement path switch and a node on the opposite side are connected commonly, a common connecting node of the measurement path switches being connected to one of the measurement path bumps on the second semiconductor chip, the measurement path bump which commonly connects the measurement path switch in the second semiconductor chip is connected to at least one of the voltage measurement terminals which the common connecting node of the measurement path switch is connected to the other voltage measurement terminal in the first semiconductor chip.

Alternatively, the semiconductor device may be configured such that, in each of the first and second semiconductor chips, all of the current path switches except two switches are connected such that all of the main bumps can be connected in series by connecting alternate ones of the connecting points adjacent to each other and besides the connecting point of each measurement path switch and a node on the opposite side are connected commonly, one of the two current path switches in the second semiconductor chip being connected between the connecting point at one end of the series connection path of the main bumps and the current path bump while a common connection node of the measurement path switch is connected to the measurement path bump, the current path bump in the first semiconductor chip being connected to one of the two current path terminals and the connecting point positioned at the other end of the series connection path of the main bumps is connected to the other one of the current path terminals through the remaining one of the two current path switches while the measurement path bump is connected to one of the two measurement path terminals and the common connecting point of the measurement path switch is connected to the remaining one of the two measurement path terminals.

In both cases, the semiconductor device may be configured such that the control circuit provided on each of the first and second semiconductor chips is formed from a shift register configured to shift data for switching on the measurement path switch connected in parallel to one of the main bumps, which is a measurement object, in synchronism with the same clock signal, and the measurement and control bumps include a clock signal bump for sending the clock signal from the first semiconductor chip to the second semiconductor chip while the plural measurement and control terminals include an input terminal for the clock signal.

Or, the semiconductor device may be configured such that the measurement and control bumps include a test signal bump for sending a test signal for switching on the current path switches from the first semiconductor chip to the second semiconductor chip while the measurement and control terminals include an input terminal for the test signal. In this instance, preferably the semiconductor device is configured such that the control circuit provided on each of the first and second semiconductor chips is formed from a shift register configured to shift data for switching on at least the measurement path switch from between the current path switch and measurement path switch connected in parallel to one of the main bumps, which is a measurement object, in synchronism with the same clock signal, each of the first and second semiconductor chips further including an internal circuit, a plurality of blocking control switches configured to individually cut the connection between the internal circuit and the main bumps upon testing, and an inverter configured to generate an inverted signal of the test signal and applying the inverted signal to control nodes of the blocking control switches.

According to another embodiment of the present invention, there is provided a semiconductor integrated circuit including an internal circuit, a plurality of blocking control switches, a plurality of main bumps configured to connect a different semiconductor integrated circuit whose connection and non-connection to the internal circuit are controlled through the blocking control switches, a plurality of measurement path switches connected individually to the main bumps, a plurality of current path switches connected individually to connecting points between the main bumps and the measurement path switches, a control circuit for the measurement path switches, a plurality of measurement and control terminals configured to input a control signal of the control circuit to supply fixed current to be supplied to the current path switches to measure the voltage at the connecting points, and a plurality of measurement and control bumps for the control signal and measurement of the fixed current and the connecting points.

According to a further embodiment of the present invention, there is provided a semiconductor integrated circuit including an internal circuit, a plurality of blocking control switches, a plurality of main bumps configured to connect a different semiconductor integrated circuit whose connection and non-connection to the internal circuit are controlled through the blocking control switches, a plurality of measurement path switches connected individually to the main bumps, a plurality of current path switches connected individually to connecting points between the main bumps and the measurement path switches, a control circuit for the measurement path switches, and a plurality of measurement and control bumps configured to supply the control signal and the fixed current from the different semiconductor integrated circuit or executing measurement at the connecting points.

According to a still further embodiment of the present invention, there is provided a bump resistance measurement method including the steps of forming a current path for supplying fixed current to main bumps for connecting two semiconductor chips through a current path bump different from the main bumps, forming a voltage measurement path to which the fixed current is not supplied on the two semiconductor chips through a measurement path bump different from the main bumps, a control circuit which is capable of selecting at least the voltage measurement path from between the current path and the voltage measurement path being provided in advance for each of the main bumps to the chips, supplying the fixed current from one of the chips to the current path through the current path bump, measuring a voltage appearing across the main bump, to which the fixed current is supplied and which is a measurement object, from the one chip through the voltage measurement path, and measuring the connection resistance of the main bump which is the measurement object from the value of the measured voltage and the value of the fixed current.

The semiconductor devices, semiconductor integrated circuit and bump resistance measurement method are advantageous in that the resistance of a bump for interconnection of chips can be measured readily with a high degree of accuracy at a low cost.

The above and other features and advantages of the present invention will become apparent from the following description and the appended claims, taken in conjunction with the accompanying drawings in which like parts or elements denoted by like reference symbols.

DETAILED DESCRIPTION OF THE PREFERRED EMBODIMENTS

First, an outline of a measurement method according to the present invention is described.

In the present measurement method, the Kelvin method is utilized for the measurement of bump resistance and a current path and a voltage measurement path are provided separately from each other so as to raise the measurement accuracy. Further, the current path and the voltage measurement path are secured for all of bumps. Further, specification of a failed bump place of connection resistance is facilitated.

In such a specification method as just mentioned, where an address is allocated to a location of each bump to be measured, in order to individually allocate an address, for example, to four-thousand bumps, a 13-bit bus and a decoder are required. Consequently, an increased occupation area is required for a circuit to be applied for measurement.

Therefore, in preferred embodiments of the present invention, in order to suppress the increase of the chip area for measurement as far as possible, the following countermeasure is taken. In particular, an address variation method which uses a shift register is adopted so that a measurement object bump can be specified. Further, since the shift register is used, a wiring line (hereinafter referred to as data inputting wiring line) for successively shifting the bump address of the shift register is configured from a 1-bit bus.

Two embodiments of the present invention are described more particularly below based on the characteristics just described. It is to be noted that, while bump connection between two chips is described as an example, the present invention can be applied also where three or more chips are placed one on another in different or where a plurality of sub chips are bump connected to different portions of a main chip which serves as a base chip. Basically, in any case, basic connection is connection of two chips described below.

First Embodiment

Figure 2:
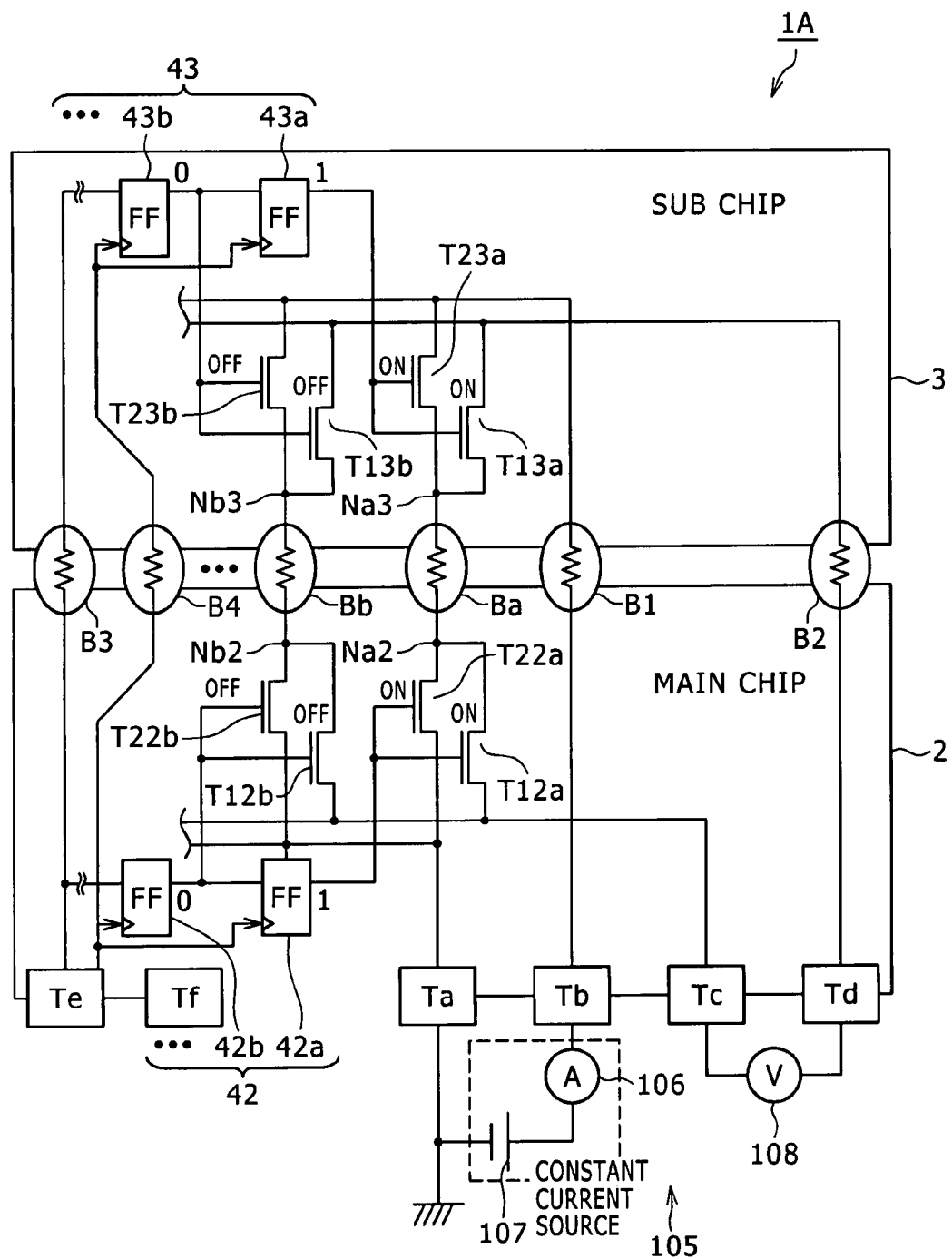
FIGS. 2 and 3 are block diagrams schematically showing semiconductor device according to first and second embodiments of the present invention.

FIG. 2 is a block diagram schematically showing a semiconductor device 1A according to a first embodiment of the present invention.

Referring to FIG. 2, the semiconductor device 1A shown includes a main chip (MAIN chip) 2 which serves as a base chip, and a sub chip (SUB chip) 3 to be bump connected to the main chip 2. The two chips are arranged in a CoC structure.

While each of the main chip 2 and the sub chip 3 includes an internal circuit for executing a function of the chip, illustration of the internal circuit is omitted in FIG. 2. In FIG. 2, bumps provided between the chips and indicated by reference characters "Ba", "Bb" and . . . function as bumps (main bumps) necessary for operation between the chips, and the other four bumps B1 to B4 function as bumps (measurement and control bumps) added for measurement and control as a result of application of the present invention. While the two main bumps Ba and Bb are shown in FIG. 2, several hundreds to several thousands main bumps are provided on an actual device.

The measurement and control bumps include the bump (current path bump) B1 to be connected to a current path, the bump (measurement path bump) B2 to be connected to a voltage measurement path, the bump B3 to which a data signal (bit string) as a control signal for address variation is inputted, and the bump (clock signal bump) B4 to which a clock signal is inputted.

Six outside terminals Ta, Tb, Tc, Td, Te and Tf are provided on a bottom face (indicated by a bottom edge in FIG. 2) of the main chip 2.

Figure 1:
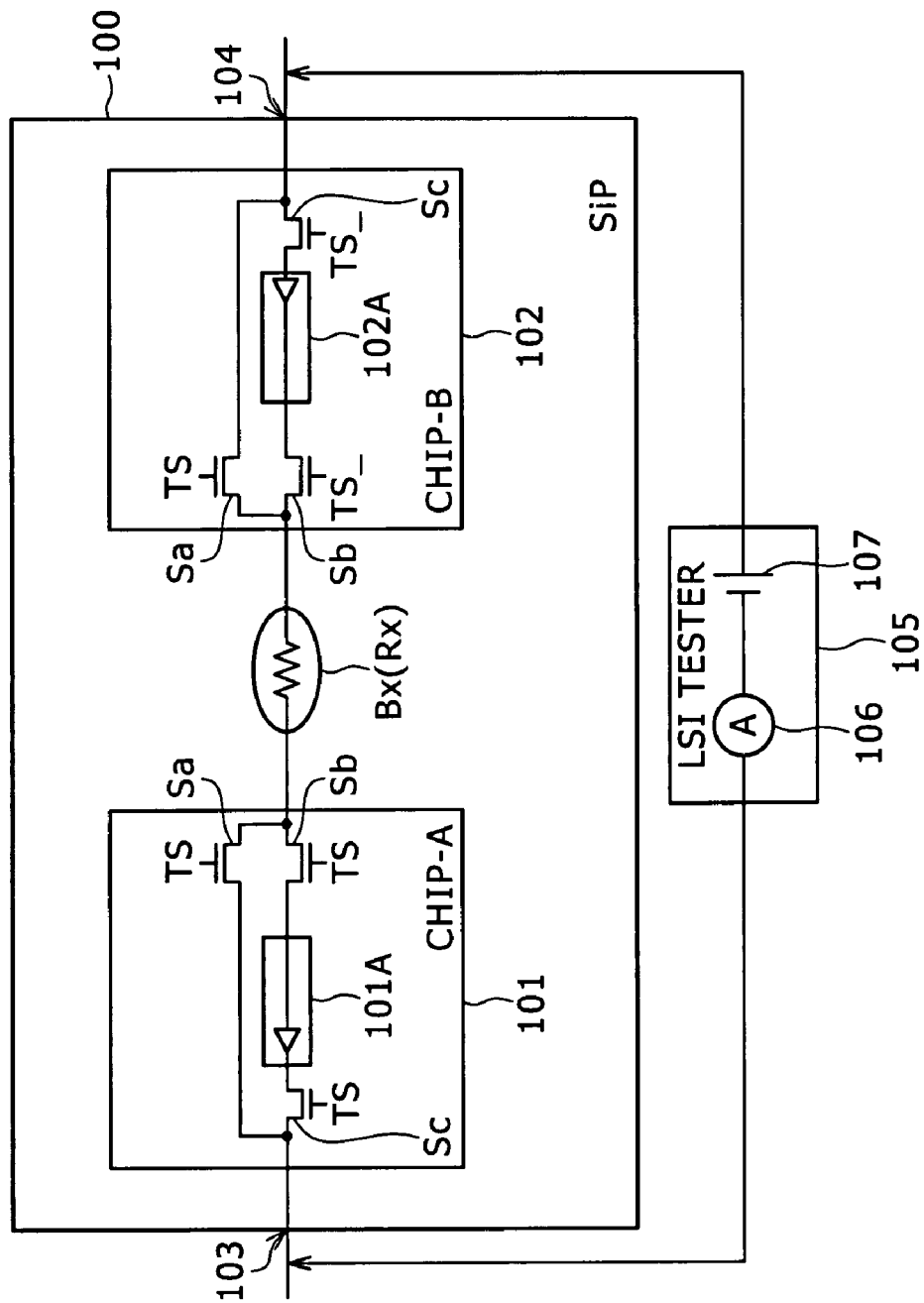
FIG. 1 is a circuit diagram showing switches and internal circuits connected to one bump used for interconnecting two chips.

The terminals Ta and Tb are connected to the current path and hence to a constant voltage source of an outside LSI tester 105 (refer to FIG. 1). In FIG. 2, an ammeter 106 and a constant voltage source 107 are provided in the LSI tester 105. The terminal Ta is connected to the ground in the tester 105 while the constant voltage source 107 and the ammeter 106 are connected between the ground and the terminal Tb.

The terminals Tc and Td function as measurement path terminals connected to the voltage measurement path. A voltmeter 108 in the LSI tester 105 is connected between the terminals Tc and Td.

The terminal Te is connected to the bump B3 and functions as a data input terminal for applying address variation. The terminal Tf is a clock input terminal. The data and the clock signal are supplied from the LSI tester 105.

It is to be noted that, while the terminals are shown directly connected to the LSI tester 105 in FIG. 2, actually the terminals are connected through a substrate.

As recognized from the arrangement of the terminals described above, all of the terminals for allowing the semiconductor device of the present invention to establish connection to the outside are provided on the main chip 2 side, but connection from the sub chip 3 to the substrate through terminals is not provided. While the sub chip 3 may alternatively be connected to the substrate, in order to indicate that the present invention can be applied to individually measure the bump resistance also where the sub chip 3 is not connected to the substrate in this manner, all of the terminals in the present embodiment are provided on the main chip 2 side.

A shift register 42 as a control circuit is provided on the main chip 2. Another shift register 43 as another control circuit is provided on the sum chip 3. In the present embodiment, the shift registers are configured by connecting a plurality of flip-flop circuits (FF) in series. The shift registers operate in synchronism with a clock signal applied from the main chip 2.

The shift register 42 of the main chip 2 includes a flip-flop circuit 42a for outputting an active logic level, for example, "1" upon measurement of the bump Ba. At this time, all of the other flip-flop circuits of the shift register 42 output the inactive logic level "0". The flip-flop circuit 42b at the next stage outputs an active logic level, for example, "1" upon measurement of the bump Bb. At this time, all of the other flip-flop circuits (FF) including the flip-flop circuit 42a output the inactive logic level "0".

In particular, data whose only one bit indicates the level "1" is inputted to the input of the shift register 42 formed from a series connection of the flip-flop circuits FF, and the level "1" is successively shifted in response to a clock input while measurement is performed for each shifting operation. It is to be noted that, according to such data input as just described, the bumps Bb and Ba shown in FIG. 2 are measured in the second last measurement cycle and the last measurement cycle, respectively.

While repetitive description is omitted, also the shift register 43 on the sub chip 3 side is configured similarly to the shift register 42. However, the shift register 43 and the bumps B3 and B4 are connected to each other so that the data and the clock signal are supplied from the main chip 2 side through the bumps B3 and B4, respectively.

Transistor circuits formed between the shift registers 42 and 43 and the bumps are switches for controlling the current path and the measurement path, and a bump of a measurement object is selected and the Kelvin connection is implemented by the switches.

In particular, on the main chip 2, current path switches T22a, T22b, . . . are connected between the terminal Ta retained at the ground potential and the bumps Ba, Bb, . . . . A measurement path switch T12a is connected between a connecting point Na2 between the current path switch T22a and the bump Ba and the terminal Tc. Similarly, a measurement path switch T12b is connected between a connecting point Nb2 between the current path switch T22b and the bump Bb and the terminal Tc. The connection relationship is repetitively provided similarly also for the different main bumps not shown.

Also on the sub chip 3, a plurality of measurement path switches T13a, T13b, . . . and a plurality of measurement path switches T23a, T23b, . . . are connected to in a connection scheme substantially similar to that of the main chip 2. It is to be noted that a connecting point of the sub chip 3 corresponding to the connecting point Na2 of the main chip 2 is indicated by a reference symbol "Na3" and a connecting point of the sub chip 3 corresponding to the connecting point Nb2 is indicated by a reference symbol "Nb3". On the sub chip 3, the nodes of the measurement path switches T13a, T13b, . . . on the side opposite to the connecting points Na3 and Nb3 are connected commonly and connected to the bump B2. The bump B2 is connected to the terminal Td by a wiring line on the main chip 2.

In the Kelvin connection, where the resistance of, for example, the bump Ba is to be measured, if the resistance between the connecting points Na2 and Na3 across the bump Ba is measured, then the high-accuracy measurement can be performed without being influenced by the voltage drop by current flowing through the current path. Therefore, switching operation is performed as described below.

Where the resistance of the bump Ba is to be measured, since the outputs of the flip-flop circuits 42a and 43a indicate the level "1" as shown in FIG. 2, all of the four transistor switches to be controlled by the outputs, that is, the measurement path switches T12a and T13a and the current path switches T22a and T23a, are switched on. Consequently, constant current is supplied from the terminal Tb to the terminal Ta through the bump B1, current path switch T23a in the on state, connecting point Na3, bump Ba, connecting point Na2, and current path switch T22a in the on state, and as a result, the current path is formed. At this time, since the output of the flip-flop circuit (FF) at the preceding stage indicates the level "0", all of the four transistor switches corresponding to the different bump Bb are off.

The voltage between the terminals Tc and Td is measured in this state. The voltage measurement path is formed from a loop through the measurement path switch T12a in the on state, connecting point Na2, bump Ba, connecting point Na3, current path switch T13a in the on state and bump B2 to the terminal Td.

Accordingly, the connection resistance of the bump Ba can be measured in a high degree of accuracy by the Kelvin connection method which can eliminate the influence of the voltage drop of the current path.

Where the connection resistance of the bump Bb is to be measured, the output of the flip-flop circuits 42b and 43b is reversed from "0" to "1" while the output of the other flip-flop circuits (FF) exhibits "0". Consequently, the transistor switches which are to indicate an on state are shifted to the four transistor switches corresponding to the bump Bb, and this changes part of the current path and part of the measurement path in route. Therefore, fixed current flows between the terminals Ta and Tb while voltage measurement is performed between the terminals Tc and Td similarly as described hereinabove.

This operation is repeated until the voltage across all main bumps is measured. Then, based on a result of the measurement, the LSI tester 105 detects whether or not there exists failure in bump connection in the semiconductor device 1A and specifies, if such failure exists, the position of the failure.

According to the present embodiment, resistance measurement by the Kelvin connection which is high in measurement accuracy can be carried out readily and with certainty. The number of transistor switches is four per one main bump and also the control circuit is formed from a single shift register. Therefore, the circuits added for the measurement are small in scale.

It is to be noted that, where three or more chips are placed one on another vertically, a clock signal is passed also to the third stage chip through the second stage chip and a switch is provided to select whether or not a data input path should be separated. In this manner, a countermeasure is required for allowing only the shift register on the third stage chip to operate without allowing the shift register on the second stage chip to operate.

Second Embodiment

Figure 3:
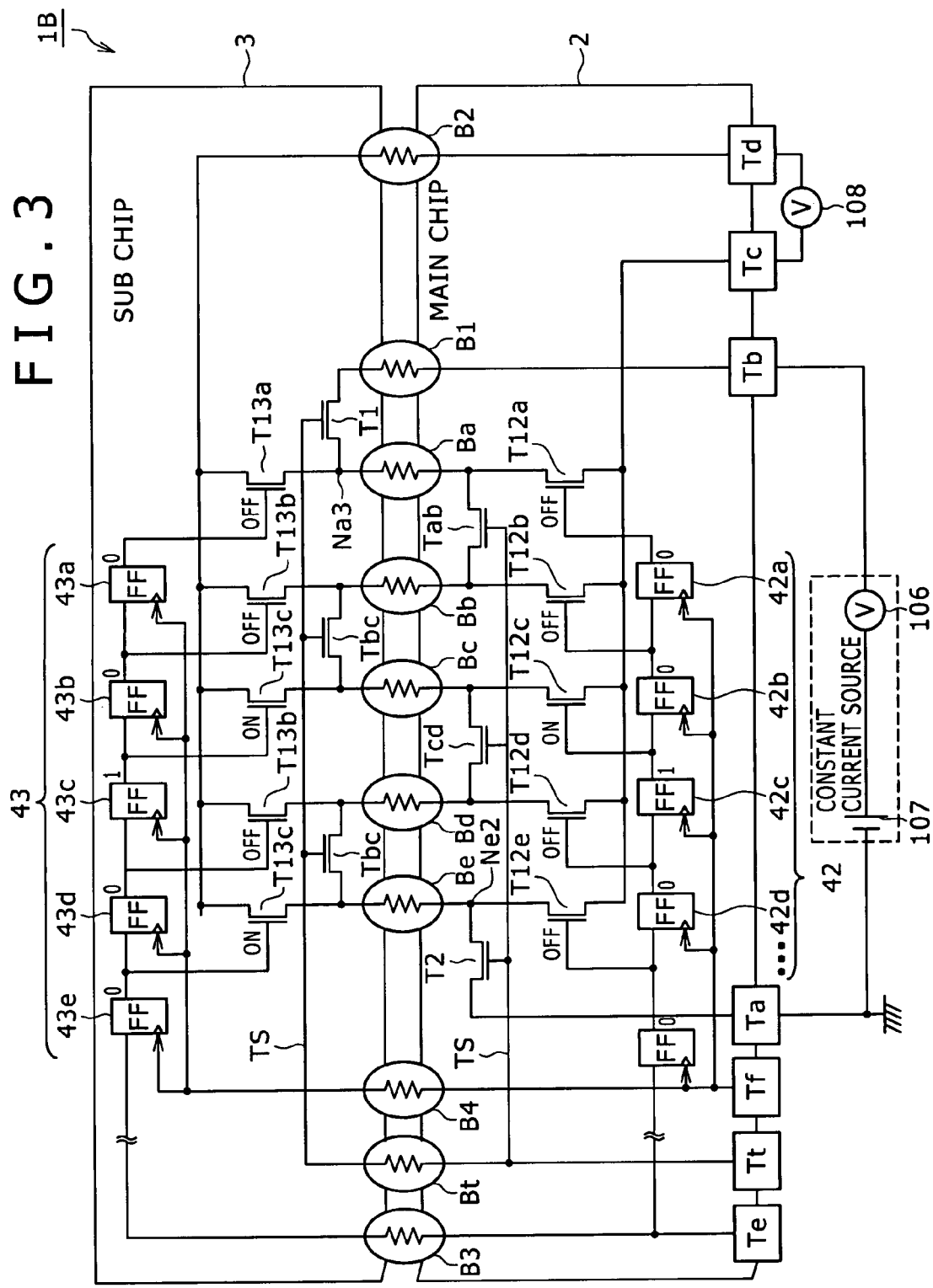

FIG. 3 shows a general configuration of a semiconductor device 1B according to a second embodiment of the present invention.

Referring to FIG. 3, the semiconductor device 1B shown is a modification to the semiconductor device 1A according to the first embodiment described hereinabove with reference to FIG. 2 but is different in a configuration relating to the voltage measurement path. Therefore, the following description is given principally of the different configuration mentioned.

The semiconductor device 1B shown in FIG. 3 includes five main bumps Ba to Be. Of the main bumps Ba to Be, the bumps Ba and Bb are similar to those in the semiconductor device 1A described hereinabove. Also each of the remaining bumps Bc, Bd and Be is connected between the terminals Tc and Td through a corresponding one of measurement path switches T12c, T12d and T12e and a corresponding one of current path switches T13c, T13d and T13e to form a voltage measurement path.

For switching control of the switches, each of the shift registers 42 and 43 shown in FIG. 3 has five stages of flip-flop circuits (FF). In FIG. 3, the semiconductor device 1B is shown in a state wherein the two transistor switches corresponding to the bump Bc are on while all of the other transistor switches are off.

On the other hand, current path switches T1, Tab, Tbc, Tcd, Tde and T2 in the present semiconductor device 1B are corrected in a connection scheme different from that shown in FIG. 2 as described below. It is to be noted that the five current path switches represent several hundreds to several thousands main bumps as are provided normally.

In particular, the current path switch Tab interconnects the bumps Ba and Bb, and the current path switch Tbc interconnects the bumps Bb and Bc. The current path switch Tcd interconnects the bumps Bc and Bd, and the current path switch Tde interconnects the bumps Bd and Be. The current path switches T1, Tbc and Tde are provided on the sub chip 3 and the current path switches Tab, Tcd and T2 are provided on the main chip 2. The current path switches on each of the chips individually interconnect different pairs of bumps, and the current path switches on the two chips interconnect different alternate pairs of bumps. Consequently, when all of the current path switches T1, Tab, Tbc, Tcd, Tde and T2 are on, a single current path is formed from a chain connection of the six current path switches and the five main bumps.

One of the source and the drain of the current path switch T1 which is positioned at one of the opposite ends of the single current path is connected to the connecting point Na3 of the bump Ba while the other is connected to the bump B1. Meanwhile, one of the source and the drain of the current path switch T2 which is positioned at the other end of the single current path is connected to the connecting point Na2 of the bump Be while the other is connected to the terminal Ta. As a result, it is possible to let fixed current flow between the terminals Ta and Tb.

A test signal TS is inputted so that all of the current path switches T1, Tab, Tbc, Tcd, Tde and T2 exhibit an on state. An inverted test signal TS_ is generated by each of inverters INV1 and INV2 formed on the chips 2 and 3, respectively, and is used to control the internal circuit of the chip between connection and disconnection (refer to FIG. 4).

In order to input the test signal TS, a terminal Tt is provided on the main chip 2, and a bump Bt (test signal bump) is provided as one of measurement and control bumps for sending the test signal TS between the main chip 2 and the sub chip 3. It is to be noted that it is otherwise possible to provide a single inverter on the main chip 2 side while two bumps are provided for individually sending the test signal TS and the inverted test signal TS_ to the sub chip 3 therethrough.

As described hereinabove, when the test signal TS is inputted ("1" is inputted), all of the current path switches T1, Tab, Tbc, Tcd, Tde and T2 are switched on. Consequently, a single current path is formed from the chain connection of the switched.

Meanwhile, the number of bumps of an object of measurement to be specified is limited to one (in the example shown in FIG. 3, the bump Bc) by parallel outputs of the shift registers 42 and 43 in accordance with a data signal. When fixed current flows through the single current path formed from the chain connection to the bump of the measurement object, even if a high resistance location is included in the current path, if the driving capacity of the constant current source is sufficiently high, then fixed current can be supplied. Therefore, dispersion of the connection state of the main bumps other than the measurement object bump existing on the current path and the on-resistance of the current path switches does not have a bad influence on the current driving. Further, since the voltage across the measurement object bump is measured similarly as in the first embodiment, even if the other main bumps have dispersion in connection resistance, the dispersion does not have an influence on the accuracy in measurement.

Further, in the second embodiment, the number of transistor switches is three per one bump and is reduced from that in the first embodiment.

Figure 4:
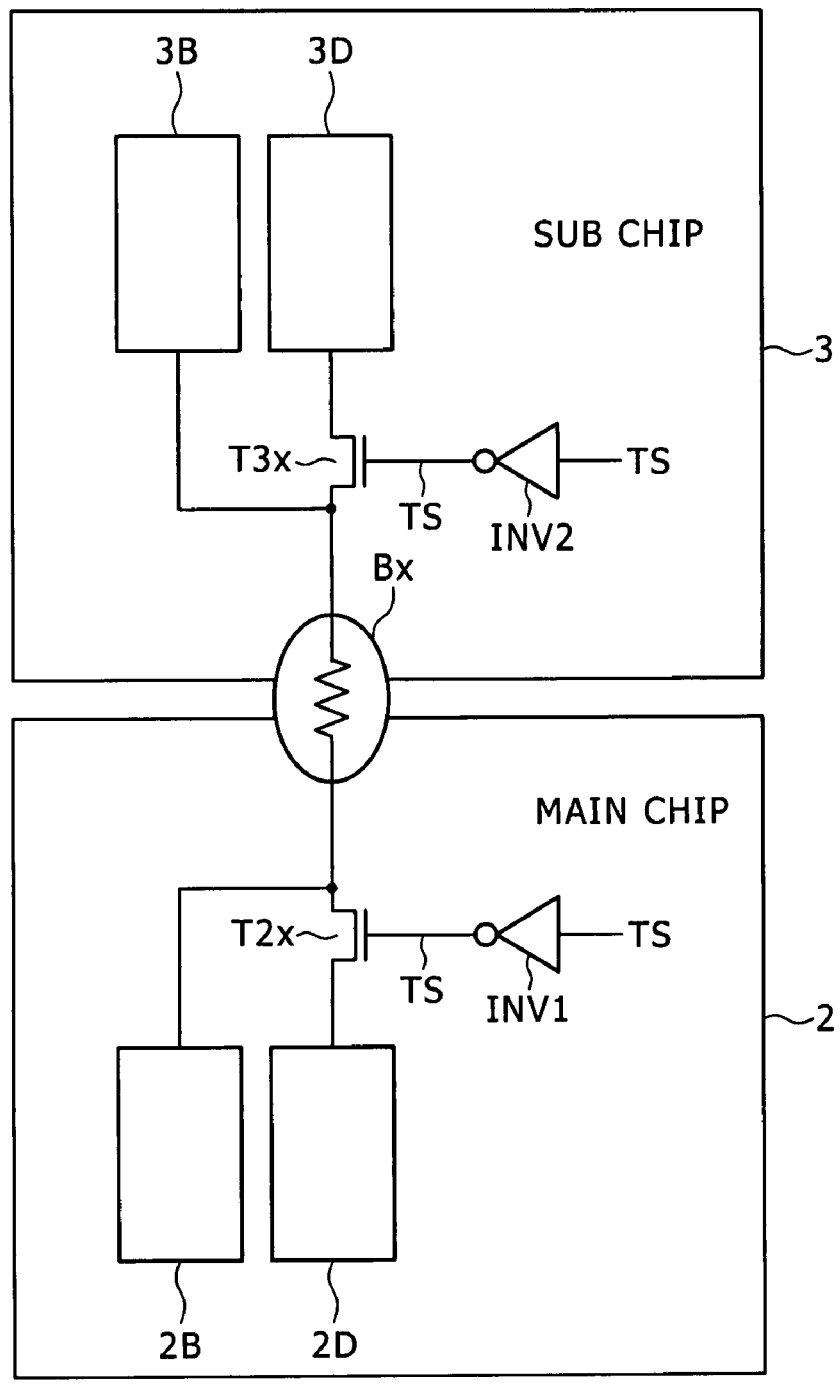
FIG. 4 is a block diagram generally showing a semiconductor device having a blocking switch between an internal circuit and a bump resistance measurement circuit.

In the first and second embodiments described above, where the circuits indicated by particular circuit elements in FIG. 2 or 3 are denoted by reference characters "2B" and "3B" in FIG. 4, switches T2x and T3x (x=a, b, c, . . . ) for disconnecting the internal circuits 2D and 3D from the bump Bx in a measurement mode but connecting the internal circuits 2D and 3D to the bump Bx in an ordinary operation mode are required.

However, in the semiconductor device 1A of FIG. 2, if all of the transistor switches shown are controlled so as to be switched off in an ordinary operation mode, then the circuit shown in FIG. 2 (circuits 2B and 3B in FIG. 4) are placed into a state disconnected from the internal circuits 2D and 3D, respectively. Therefore, it is not always necessary to particularly provide the switches T2x and T3x. However, such switches may be provided in order to make the disconnection sure. The switches T2x and T3x are controlled by the inverted test signal TS_ outputted from the inverter INV1 or INV2.

Meanwhile, in the semiconductor device 1B of FIG. 3, if the current path switches T1, Tab, Tbc, Tcd, Tde and T2 are each formed from a transistor which normally indicates an off state when no signal is applied thereto, then there is no necessity to particularly provide the switches T2x and T3x. However, such switches may be provided in order to make the disconnection sure.

It is to be noted that, in the semiconductor device 1B shown in FIG. 3, the fixed current applying circuit (constant current source) is miniaturized from that in FIG. 2. It is to be noted, however, that, since the bumps are chain connected in series, the combined resistance between the terminals Ta and Tb is higher than that in FIG. 2. Therefore, the voltage between the terminals Ta and Tb becomes higher, and therefore, it is necessary to limit the voltage within a range within which no forward leak occurs from a junction of the source or the drain of each transistor. On the other hand, in the semiconductor device 1B shown in FIG. 3, since there is no necessity to switch the fixed current when the bump of the measurement object is changed over, the measurement time decreases from that of the semiconductor device 1A shown in FIG. 2.

According to the embodiments of the present invention, the connection resistance of interconnection bumps (internal bumps) of a plurality of chips formed in a semiconductor device can be measured readily with a high degree of accuracy at a low cost.

It is to be noted that the bump resistance measurement method according to the present invention presupposes provision of such connection and configuration as described above in advance and has the following characteristics.

In particular, a current path for supplying fixed current to main bumps for connecting two semiconductor chips is formed through a current path bump different from the main bumps, and a voltage measurement path to which the fixed current is not supplied is formed on the two semiconductor chips through a measurement path bump different from the main bumps. A control circuit which is capable of selecting at least the voltage measurement path from between the current path and the voltage measurement path is provided in advance for each of the main bumps to the chips. Then, the fixed current is supplied from one of the chips to the current path through the current path bump, and a voltage appearing across the main bump, to which the fixed current is supplied and which is a measurement object, is measured from the one chip through the voltage measurement path. Then, the connection resistance of the main bump which is the measurement object is measured from the value of the measured voltage and the value of the fixed current.

While preferred embodiments of the present invention have been described using specific terms, such description is for illustrative purpose only, and it is to be understood that changes and variations may be made without departing from the spirit or scope of the following claims.

What is claimed is:

1. A semiconductor device, comprising:
   a first semiconductor chip; and
   a second semiconductor chip connected to said first semiconductor chip through a plurality of bumps including not only a number of main bumps necessary for operation between the chips but also a predetermined number of measurement and control input bumps;
   each of said first and second chips including
      a plurality of measurement path switches individually connected to the main bumps,
      a plurality of current path switches connected to connecting points between the main bumps and the measurement path switches, and
      a control circuit for the measurement path switches,
   said first semiconductor chip further including a plurality of measurement and control terminals for inputting a control signal of the control circuit and supplying fixed current to be supplied to the current path switches and then measuring the voltage at the connecting points.

2. The semiconductor device according to claim 1, wherein the measurement and control input bumps include:
   a current path bump;
   a measurement path bump; and
   a plurality of control input bumps;
   the measurement and control terminals including
   a test signal input terminal configured to input a test signal for switching on the current path switches,
   two current supplying terminals configured to supply fixed current to the current path switches which are in an on state through the current path bump on each of said first and second semiconductor chips,
   an input terminal for the control signal for operating the two control circuits provided individually on said first and second semiconductor chips, and
   two voltage measurement terminals used for measurement of a voltage between the opposite ends of the main bump, to which the fixed current is supplied, through the measurement path bump.

3. The semiconductor device according to claim 2, wherein, on each of said first and second semiconductor chips, a current path switch is provided at each connecting point between the main bumps and the measurement path switches and the connecting point of each measurement path switch and a node on the opposite side are connected commonly;
   a common connecting node of the measurement path switches being connected to one of the measurement path bumps on said second semiconductor chip;
   the measurement path bump which commonly connects the measurement path switch in said second semiconductor chip is connected to at least one of the voltage measurement terminals which the common connecting node of the measurement path switch is connected to the other voltage measurement terminal in said first semiconductor chip.

4. The semiconductor device according to claim 3, wherein the control circuit provided on each of said first and second semiconductor chips is formed from a shift register configured to shift data for switching on the measurement path switch connected in parallel to one of the main bumps, which is a measurement object, in synchronism with the same clock signal, and
   the measurement and control bumps include a clock signal bump for sending the clock signal from said first semiconductor chip to said second semiconductor chip while the plural measurement and control terminals include an input terminal for the clock signal.

5. The semiconductor device according to claim 2, wherein, in each of said first and second semiconductor chips, all of the current path switches except two switches are connected such that all of the main bumps can be connected in series by connecting alternate ones of the connecting points adjacent to each other and besides the connecting point of each measurement path switch and a node on the opposite side are connected commonly;
   one of the two current path switches in said second semiconductor chip being connected between the connecting point at one end of the series connection path of the main bumps and the current path bump while a common connection node of the measurement path switch is connected to the measurement path bump;
   the current path bump in said first semiconductor chip being connected to one of the two current path terminals and the connecting point positioned at the other end of the series connection path of the main bumps is connected to the other one of the current path terminals through the remaining one of the two current path switches while the measurement path bump is connected to one of the two measurement path terminals and the common connecting point of the measurement path switch is connected to the remaining one of the two measurement path terminals.

6. The semiconductor device according to claim 5, wherein the control circuit provided on each of said first and second semiconductor chips is formed from a shift register configured to shift data for switching on the measurement path switch connected in parallel to one of the main bumps, which is a measurement object, in synchronism with the same clock signal, and
   the measurement and control bumps include a clock signal bump for sending the clock signal from said first semiconductor chip to said second semiconductor chip while the plural measurement and control terminals include an input terminal for the clock signal.

7. The semiconductor device according to claim 5, wherein the measurement and control bumps include a test signal bump for sending a test signal for switching on the current path switches from said first semiconductor chip to said second semiconductor chip while the measurement and control terminals include an input terminal for the test signal.

8. The semiconductor device according to claim 7, wherein the control circuit provided on each of said first and second semiconductor chips is formed from a shift register configured to shift data for switching on at least the measurement path switch from between the current path switch and measurement path switch connected in parallel to one of the main bumps, which is a measurement object, in synchronism with the same clock signal, each of said first and second semiconductor chips further including:

an internal circuit;

a plurality of blocking control switches configured to individually cut the connection between the internal circuit and the main bumps upon testing; and an inverter configured to generate an inverted signal of the test signal and applying the inverted signal to control nodes of the blocking control switches.

9. A semiconductor integrated circuit, comprising:

a internal circuit;

a plurality of blocking control switches;

a plurality of main bumps configured to connect a different semiconductor integrated circuit whose connection and non-connection to the internal circuit are controlled through the blocking control switches;

a plurality of measurement path switches connected individually to the main bumps;

a plurality of current path switches connected individually to connecting points between the main bumps and the measurement path switches;

a control circuit for the measurement path switches;

a plurality of measurement and control terminals configured to input a control signal of the control circuit to supply fixed current to be supplied to the current path switches to measure the voltage at the connecting points; and a plurality of measurement and control bumps for the control signal and measurement of the fixed current and the connecting points.

10. A semiconductor integrated circuit, comprising:

an internal circuit;

a plurality of blocking control switches;

a plurality of main bumps configured to connect a different semiconductor integrated circuit whose connection and non-connection to the internal circuit are controlled through the blocking control switches;

a plurality of measurement path switches connected individually to the main bumps;

a plurality of current path switches connected individually to connecting points between the main bumps and the measurement path switches;

a control circuit for the measurement path switches; and a plurality of measurement and control bumps configured to supply the control signal and the fixed current from the different semiconductor integrated circuit or executing measurement at the connecting points.

* * * * *